(12) United States Patent
Huhse et al.

(10) Patent No.: US 8,530,810 B2
(45) Date of Patent: Sep. 10, 2013

(54) LASER SCANNING MICROSCOPE HAVING VARIABLE LIGHT INTENSITY AND CONTROL METHOD FOR THE SAME

(75) Inventors: Dieter Huhse, Berlin (DE); Stefan Wilhelm, Jena (DE); Hans Schlüter, Gera (DE); Alexander Liebhold, Leipzig (DE); Erhardt Hülße, Bad Köstritz (DE); Uwe Patz, Gera (DE)

(73) Assignee: Carl Zeiss Microscopy GmbH, Jena (DE)

( * ) Notice: Subject to any disclaimer, the term of this patent is extended or adjusted under 35 U.S.C. 154(b) by 350 days.

(21) Appl. No.: 12/863,261

(22) PCT Filed: Jan. 13, 2009

(86) PCT No.: PCT/EP2009/000128
§ 371 (c)(1),
(2), (4) Date: Jul. 16, 2010

(87) PCT Pub. No.: WO2009/090028
PCT Pub. Date: Jul. 23, 2009

(65) Prior Publication Data
US 2011/0051234 A1 Mar. 3, 2011

(30) Foreign Application Priority Data
Jan. 17, 2008 (DE) .......................... 10 2008 005 337

(51) Int. Cl.
*G01J 1/32* (2006.01)

(52) U.S. Cl.
USPC ........................................................ 250/205

(58) Field of Classification Search
USPC ................. 250/205; 359/254–279, 368–398; 327/108–112
See application file for complete search history.

(56) References Cited

U.S. PATENT DOCUMENTS

2004/0125440 A1 7/2004 Arai
2005/0195869 A1 9/2005 Kubota
2006/0086887 A1* 4/2006 Nakata et al. .............. 250/201.3

FOREIGN PATENT DOCUMENTS

DE 10148679 A1 4/2003
GB 2381690 A 5/2003

OTHER PUBLICATIONS

Andreas Weber, "Measurement and Simulation of the Turn-On Delay Time Jitter in Gain-Switched Semiconductor Lasers," 1992, IEEE Journal of Quantum Electronics, vol. 28 No. 2, pp. 441-446.*

*Primary Examiner* — Thanh Luu
*Assistant Examiner* — Renee Naphas
(74) *Attorney, Agent, or Firm* — Westerman Hattori Daniels & Adrian LLP

(57) ABSTRACT

A laser scanning microscope (LSM) having variable light intensity and a control method for the same. The light intensity of a laser beam in an LSM has been controlled to date with high accuracy, but also high costs by means of an acousto-optic component (AOM, AOTF). According to the invention, such a component for beam modulation is to be omitted, without reducing the exposure accuracy of the sample. In an LSM, a directly modulated laser diode (10) is used with an electric control (12) for direct modulation. Said laser diode (10) has a turn-on delay of the light intensity that is dependent on the amount of the control variable when subjected to an electric control variable. The control (12) is designed such that the fluctuation width ($\Delta\Delta t_V$) of the occurring turn-on delay ($\Delta t_V$) is smaller than 1 μs, particularly smaller than 0.5 μs. Thus highly exact modulation without an acousto-optic component is possible. A quick direct modulation is achieved particularly by the following steps: a) identifying that an intensity to be achieved or achieved with the laser diode (10) falls below a lower threshold value or is below the lower threshold value, b) de-energizing the laser diode (10), c) providing an electric intermediate current, d) identifying that the intensity to be achieved exceeds an upper threshold value, e) flowing the intermediate current through the laser diode (10), and f) setting the diode current according to the intensity to be achieved.

25 Claims, 6 Drawing Sheets

Figure 4:
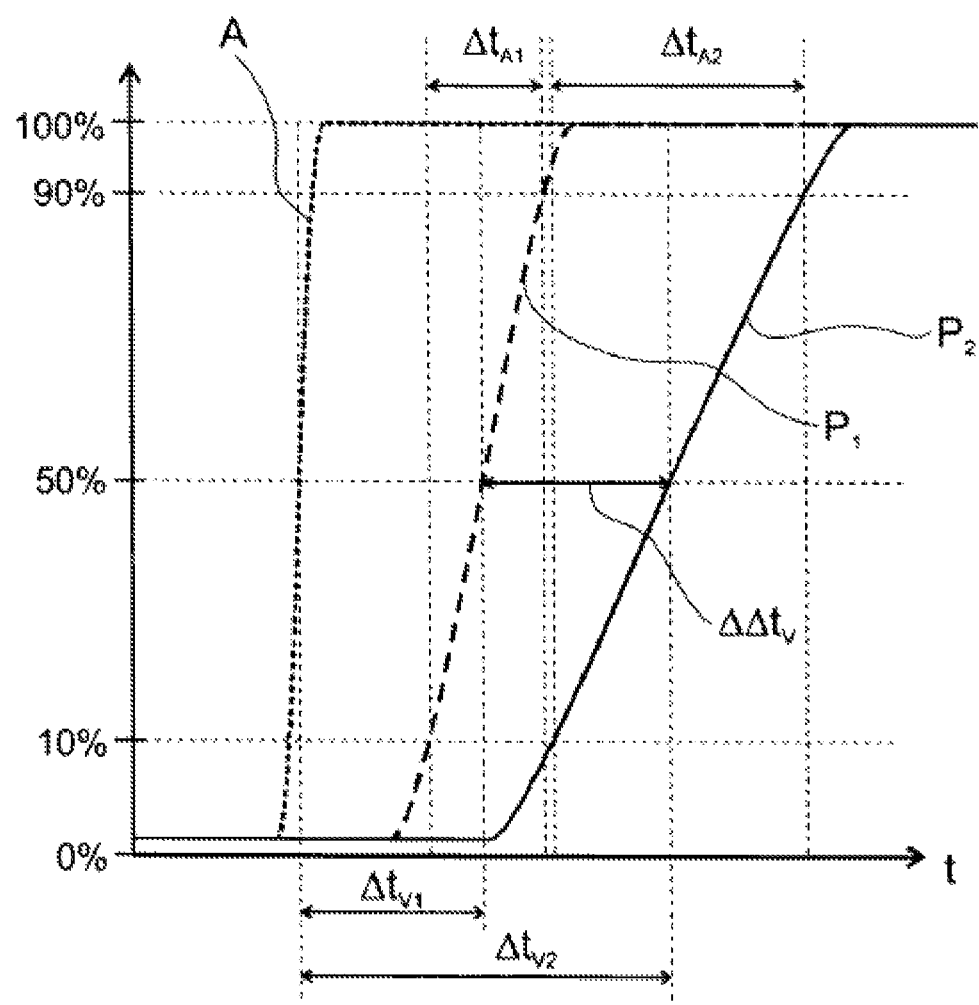

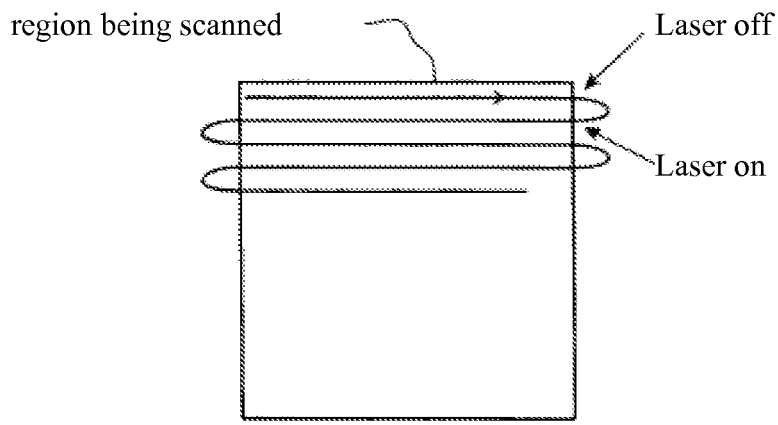
Fig. 1 - Prior art
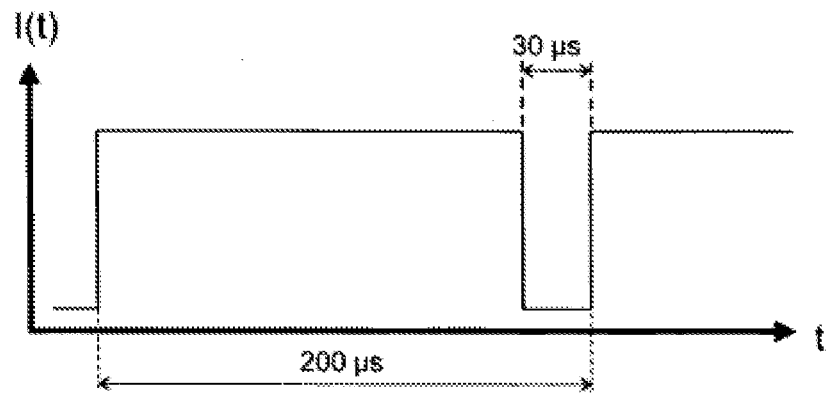
Fig. 2 - Prior art
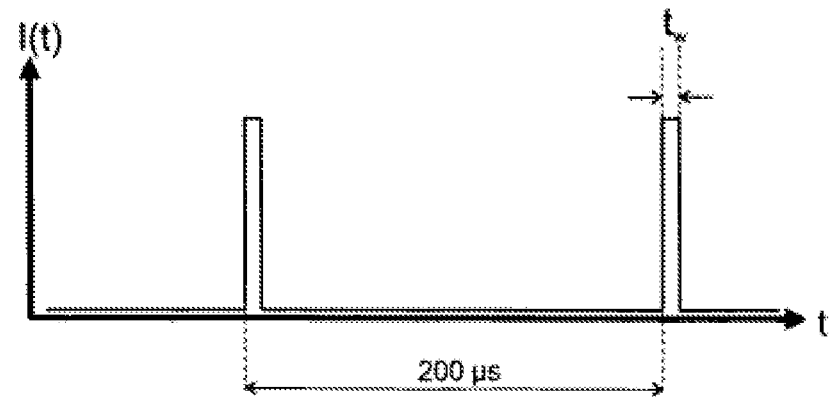
Fig. 3 - Prior art

LASER SCANNING MICROSCOPE HAVING VARIABLE LIGHT INTENSITY AND CONTROL METHOD FOR THE SAME

CROSS-REFERENCE TO RELATED APPLICATIONS

This is a national stage of international patent application no. PCT/EP2009/000128 filed Jan. 13, 2009 and published in German, which has a priority of German patent application no. 10 2008 005 337.6 filed Jan. 17, 2008, both of which are hereby incorporated by reference in their entireties.

The invention concerns a laser scanning microscope (LSM) as well as methods for controlling a laser scanning microscope during a scanning process and a correspondingly devised control unit.

Laser scanning microscopes are used for confocal recording of images of a sample by scanning with a laser beam usually deflected in a meandering pattern. Before a scanning process, individual "regions of interest" (ROI) can be established for scanning. In order to achieve high spatial precision of the light exposure, the laser should only be turned on in the regions being scanned during the scanning process and must be turned off elsewhere. The laser light should be switched on as precisely as possible upon entering the region being scanned and not before, so as to avoid unnecessary loading on the sample. This holds in particular for the edge regions of the sample in the reversal area of the laser beam, which is not generally imaged, since the speed of travel of the laser beam across the sample is the lowest in this region. Depending on the application, in addition to switching alternatively on and off from zero level, changes in the beam intensity between two intensity levels other than zero are also required.

FIG. 1 shows schematically the path traveled by the laser beam during scanning in the case of scanning across the maximum area of the imaging region. In the reversal phase outside the maximum area of the imaging region, the laser light is switched off in order to spare the sample. Two switching times are shown as an example in the drawing. FIG. 2 shows these switching cycles schematically as the intensity of the laser beam at the sample as a function of time. For example, a single horizontal scanning cycle corresponding to one image line takes 200 µs. The reversal phase in the edge regions takes, for example, 30 µs. FIG. 3 shows the switching cycles for the case of a region (ROI) of the sample that is being scanned. Again, a single horizontal scanning cycle takes 200 µs, because the scanning movement occurs across the maximum area of the imaging region. But the laser is only switched on within a narrow time window $t_w$, whose range depends on the width of the region being scanned.

In the prior art, the light intensity of a laser beam is controlled in an LSM with high precision, but in a costly manner, by means of an acousto-optical component (AOM, AOTF). Such a component has an approximately constant reaction delay to modulation changes, which can be offset by a corresponding time derivative in the modulation.

The object of the invention is to provide a laser scanning microscope, a control method for such, and a corresponding control unit in which the use of an acousto-optical component is unnecessary, yet still high spatial precision is possible for the imaging.

The object is achieved according to the invention by a laser scanning microscope having a directly modulated laser diode, which has a rise delay of the light intensity that is dependent on the magnitude of the control variable when subjected to an electrical control variable, with an electrical control unit for direct modulation, and the control unit is configured so that the fluctuation range ($\Delta\Delta t_V$) of the occurring rise delays ($\Delta t_V$) is less than 1 µs, especially less than 0.5 µs; a laser scanning microscope incorporating such a directly modulated laser diode and control unit; by a method for controlling such a directly modulated laser diode of a laser scanning microscope; and by an control unit for a directly modulated laser diode of a laser scanning microscope that is connected to a power source and has a rise delay of the light intensity that is dependent on the magnitude of the control variable when subjected to an electrical control variable, characterized by having means for identifying that an intensity to be achieved with the laser diode or already achieved falls below a lower threshold value or is below the lower threshold value, and for subsequent de-energizing of the laser diode and subsequent providing of an intermediate electric current, as well as means for identifying that the intensity to be achieved rises above an upper threshold value, and for subsequent flowing of the provided intermediate current through the laser diode and then setting the diode current according to the intensity to be achieved.

When laser light is generated with variable intensity/power by means of a laser diode, a "delay" occurs between the electrical control signal and the optical response of the system upon change in the intensity/power, which in the case of a power/intensity increase is known as a rise delay. This is the time between the rise in the electrical control signal and the reaching of 50% of the intensity difference between the starting intensity and the target intensity. It varies depending on the target intensity/power to be achieved for the laser light. Furthermore, besides the rise delay, the "rise time" is also problematical for laser diodes, being the period of time between reaching 10% and reaching 90% of the intensity difference, and it depends on the target intensity/power to be achieved for the laser light. The percentages can also be defined differently, in which case the magnitudes of the rise times or delay times will change accordingly.

FIG. 4 illustrates the variation (fluctuation range) $\Delta\Delta t_V$ between two extreme rise delays $\Delta t_{V1}$ and $\Delta t_{V2}$. For better clarity, all curves have been normalized to identical maxima. The curves shown are the electrical control signal A of a laser diode, such as the applied modulation voltage, and the outputs typically output as a function of time for an extremely high target intensity/power (curve P1) and for an extremely low target intensity/power (curve P2). If a high target intensity/power (P1) is required to be reached from the switched-off state, the rise delay $\Delta t_{V1}$ is usually much smaller than the rise time for a low target intensity/power (P2). Likewise, the rise time $\Delta t_{A1}$ for high target intensity/power (P1) is shorter than the rise time $\Delta t_{A1}$ for low target intensity/power (P2).

In laser scanning microscopy, fluctuations in the rise delay are unwanted, because they result in spatial inaccuracies for the exposure of the sample, both during observation of reflected light and during excitation of fluorescence. Thus, the use of a conventional laser diode in the laser scanning microscope is a drawback.

According to a first aspect of the invention, a laser scanning microscope is provided with a directly modulated laser diode, which when subjected to an electric control variable exhibits a rise delay of light intensity that is dependent on the magnitude of the control variable, and which is to be used with an electrical control, whereby the control is configured so that the fluctuation range of the rise delay is less than 1 µs, especially less than 0.5 µs. By fluctuation range is meant the variation of the rise delays occurring as a function of the intensity, i.e., the difference between maximum and minimum occurring rise delay.

Thanks to the slight fluctuation range of the rise delay according to the invention, being less than 1 µs, especially less than 0.5 µs, and on the same order of magnitude as the rise time, the rise delay can be assumed to be approximately constant. Thereby, a constant value for the rise delay can be assumed and set to provide for compensation through a chosen electric signal. Thanks to this assumption of a constant rise delay, the rise delay can be offset in a known fashion by early sending of the electrical control signal as a time derivative. The achievable precision of the boundaries, i.e., the resulting spatial contrast between illuminated and nonilluminated regions of the sample, then depends essentially on only the rise time. This enables a high spatial precision of the light exposure. In this way, acousto-optical modulators in the LSM can be cheaply replaced by directly modulated laser diodes for the same spatial accuracy of exposure.

Preferably, the laser diode and the control unit for the direct modulation with little fluctuation range in the rise time are arranged in a laser module that can be connected by an optical fiber to a scanning module ("scan module", "scan head", "scan unit"). In a preferred embodiment, a power source for the laser diode is likewise arranged in the laser module.

Especially preferred are embodiments in which the laser diode is provided with optical power regulation, especially using a monitor diode. In this way, high stability and low noise for the laser light are achieved, being comparable to traditional LSM lasers.

According to a second aspect of the invention, for a directly modulated laser diode of a laser scanning microscope that has a rise delay of the light intensity that is dependent on the magnitude of the control variable when subjected to an electrical control variable, a control method is proposed for achieving a nearly constant rise delay in which, if it is identified that an intensity to be achieved with the laser diode falls below a lower threshold value or that an intensity already achieved is below the lower threshold value, first of all the laser diode is deenergized and an intermediate electric current is provided, without this intermediate electric current flowing through the laser diode. Secondly, if it is identified that the intensity to be achieved rises above an upper threshold value, at first the intermediate current provided is flowed through the laser diode and then the diode current is set according to the intensity to be achieved. In the aspect of the invention, instead of the intensity achieved and or to be achieved one can use an optical power achieved or to be achieved.

This second aspect of the invention constitutes one possible way of achieving a minimal fluctuation range of the rise delay in the sense of the first aspect of the invention and, thus, an approximately constant rise delay. However, the first aspect of the invention also encompasses all other control methods for providing a fluctuation range of the rise delay of less than 1 µs, especially less than 0.5 µs.

Thanks to the immediate furnishing of the intermediate current, the rise in power/intensity begins from a defined level above the off state, so that the rise time is shortened as compared to beginning in the off state. This also decreases in particular the fluctuation range of the rise time for all target intensities/powers. Thus, the invention makes possible with little electronic or programming complexity a great temporal accuracy for the light exposure. This method is designated hereinafter and in the patent claims as currentless current-limit optimization.

Accordingly, for a control unit of a directly modulated laser diode of a laser scanning microscope that is connected to a current source, means are provided on the one hand for identifying that an intensity achieved or to be achieved with the laser diode falls below a lower threshold value or lies below the lower threshold value, and subsequent de-energization of the laser diode and subsequent providing of an intermediate electric current, and on the other hand means for identifying that the intensity to be achieved rises above an upper threshold value, and subsequent flowing of the provided intermediate current through the laser diode and subsequent adjusting of the diode current according to the intensity to be achieved.

In one preferred embodiment, the laser diode is short circuited for its de-energization, and the short circuit is removed for the flow of current. This constitutes a simple possibility of switching the laser diode in a currentless state. The removing of the short circuit allows the current to flow with little delay.

Preferably in one such embodiment for providing the intermediate current, an output current of a current source is limited. In this way, a current regulation is provided for the intermediate current in simple fashion and with high accuracy. Without a limit, an independent current or power regulation of the laser diode would raise the presumably too low output current on account of the currentless state to the available maximum in order to adjust the diode current in keeping with the target power or the target diode current. Therefore, the upper limitation leads to an exactly definable stable intermediate current.

For the adjusting of the diode current, advantageously the current limit can be removed after the flow of current through the laser diode. Since the laser diode at this time is no longer currentless, the current or power regulation of the laser diode is again in effect. Thus, in a short time the diode current is again adjusted in accordance with the target intensity/power to be achieved. This accomplishes a minimal fluctuation range of the rise delays regardless of the height of the target intensity/power to be achieved.

Alternatively, after identifying that the intensity to be achieved exceeds the upper threshold value, and before the flow of current through the laser diode, at first the current limit and thus the current regulation is removed for the intermediate current, or the current limit is set at a mean or maximum permissible diode current in order to prevent damage. Since the laser diode at this moment is still short-circuited, the current or power regulation of the laser diode produces a steep rise in the intermediate current to a mean current strength above the threshold current or beyond the diode current required for the target intensity/power to be achieved. Only then is the short circuit of the laser diode removed. The diode current is in short time again adjusted to the target intensity/power to be achieved by a current or power regulation of the laser diode. This accomplishes an extremely small fluctuation range of the rise delays, regardless of the height of the target intensity/power to be achieved.

Advantageously, a limit amplifier can be used as the current source. This enables a current limit with slight expense, both for the threshold current and also for the mean or maximum permissible diode current.

Advisedly, the intensity to be achieved is determined by means of a control variable for a feedback control of the laser diode, especially a modulation voltage.

If upper and lower threshold values are different from each other, a hysteresis will result. In other embodiments, the lower threshold value and the upper threshold value can advantageously be identical. Thus, only one comparison operation is needed.

In one preferred embodiment, at least the threshold current strength of the laser diode is used for the intermediate current. In this way, an unnecessary load on the sample by a laser diode emitting at first spontaneously beneath the threshold current can be avoided, given that each intensity/power level to be achieved is reached in short time from the threshold current strength, so that the fluctuation range of the rise delays is small. Starting from a medium current strength (in relation to the permissible diode currents) above the threshold current strength, a minimal rise delay of the optical power is achieved regardless of the target power/intensity, associated with a minimal fluctuation range of the rise delays. In other embodiments, for short rise delays, the intermediate current can be limited to a current strength above a current strength corresponding to the intensity/power to be achieved.

According to a third aspect of the invention, in order to control a laser of a laser scanning microscope during a scanning process it is proposed to identify an imminent rise of an output power or intensity of the laser from an initial to a target value and thereupon to predict an initial rise delay and/or a rise time from the beginning of the rise until the target value is reached. Then a previous point in time is determined that lies in front of the target point in time when the target value is supposed to be attained by the determined delay time. Finally, the rise is commenced at this previous point in time. In this way, the laser attains its target intensity/power with high time precision at the target point in time or with high spatial precision at the edge of the region being scanned. The prediction can be done, for example, by using "look-up tables" (LUT). The invention also encompasses a correspondingly programmed control unit. This method will be termed hereinafter as derivative optimization.

Preferably, the rise delay and/or the rise time are predicted in dependence on the target value and/or the initial value and/or in the case of a directly modulated laser diode in dependence on a currentless and intermediate current optimization of the delay time. This allows for a high accuracy of prediction.

All three aspects of the invention can be combined with each other in all embodiments. The methods of the invention can be realized in particular in the form of computer programs.

The invention will now be explained more closely by means of exemplary embodiments.

Figure 5:
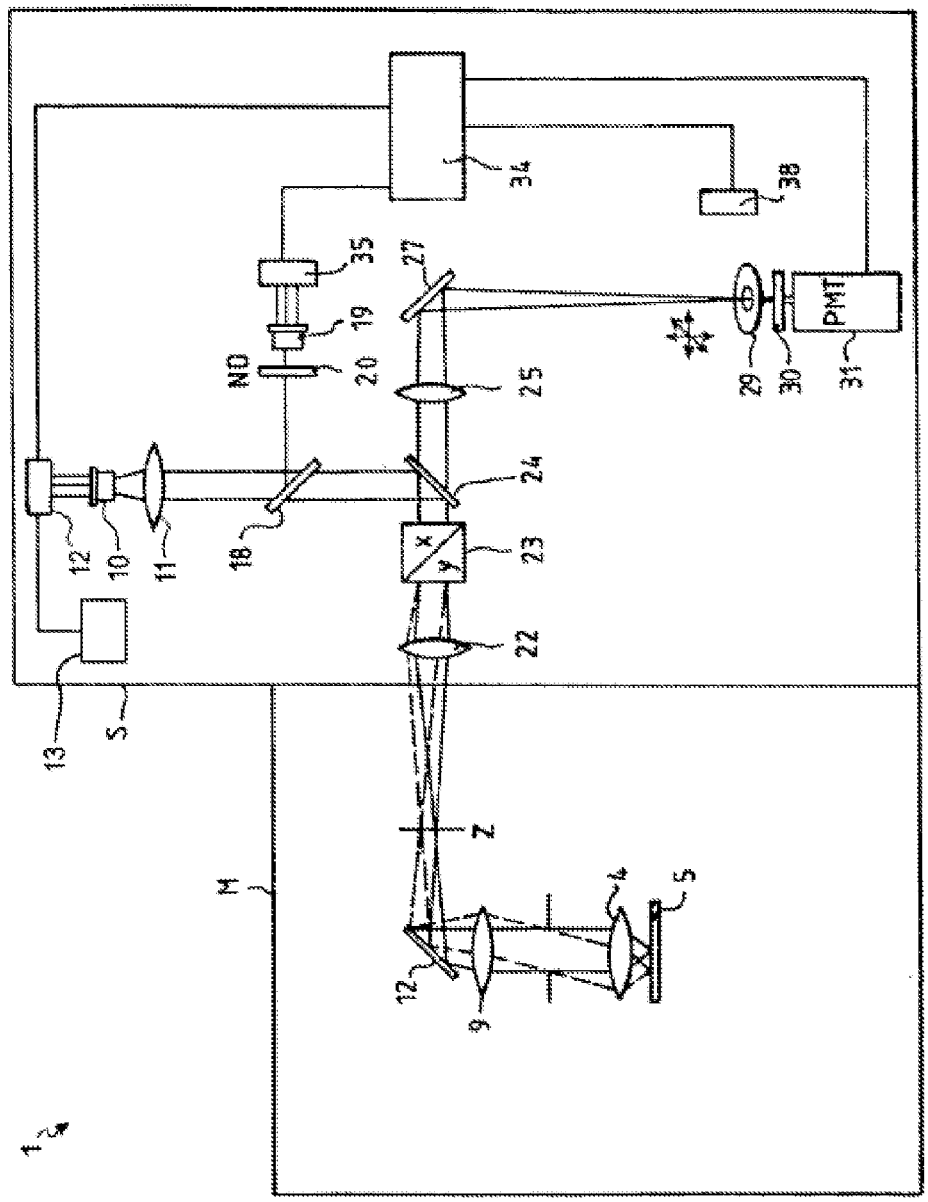
Figure 6:
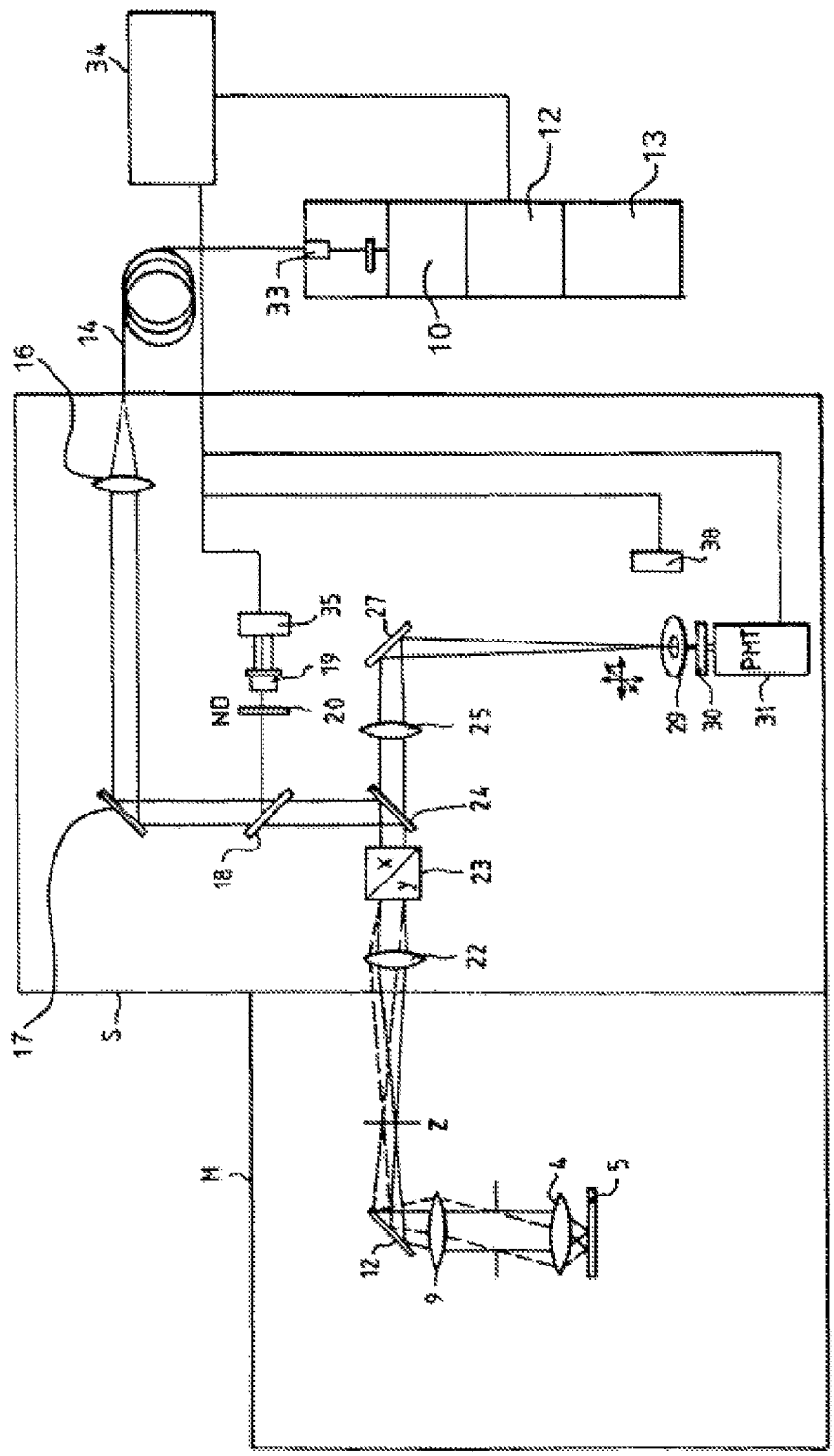
Figure 7:
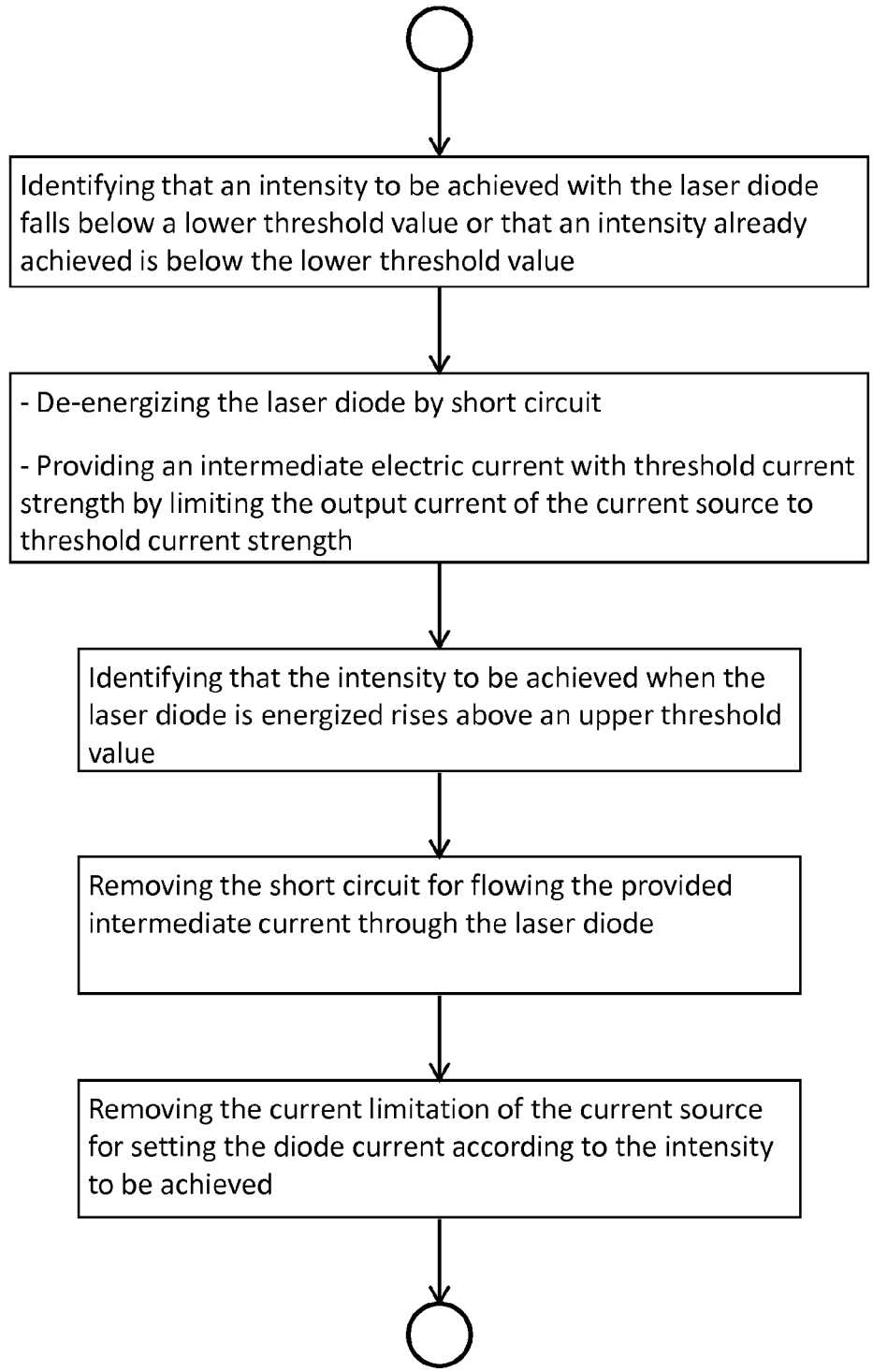
Figure 8:
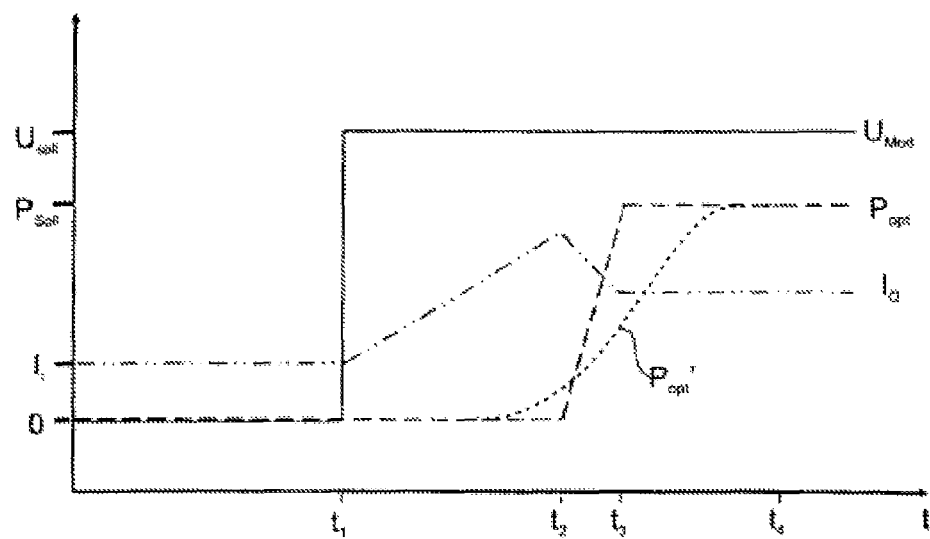
Figure 9:
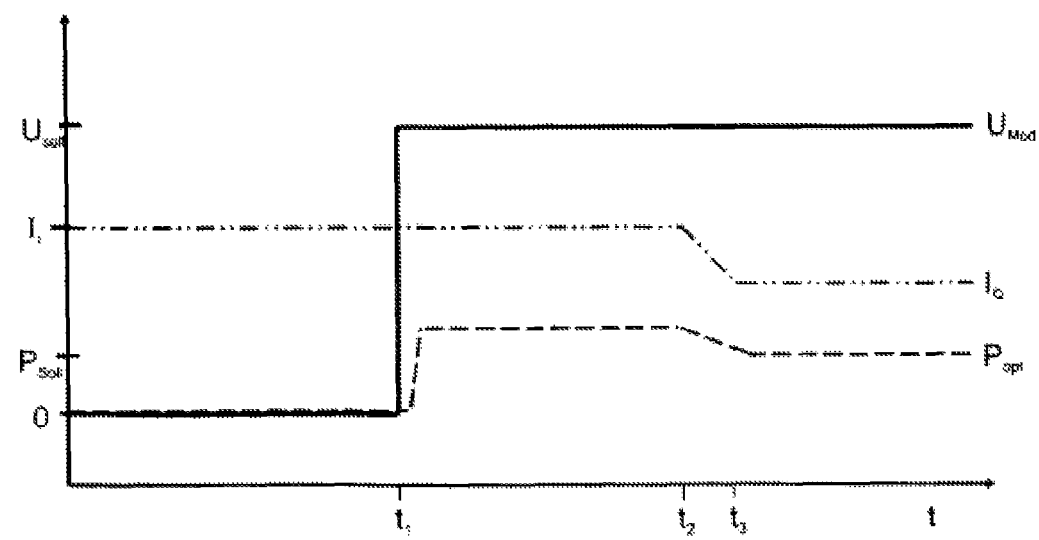

In the drawings are shown:

FIG. 1, the scanning path of a laser scanning microscope (prior art, see above), FIG. 2, a diagram of the switching cycles of the laser in the form of the intensity of the laser beam at the sample as a function of the time (prior art, see above), FIG. 3, a diagram of the switching cycles of the laser when scanning a sample region (prior art, see above), FIG. 4, the fluctuations between the rise times at different target intensities, FIG. 5, a schematic representation of a first laser scanning microscope, FIG. 6, a schematic representation of a second laser scanning microscope, FIG. 7, a flow chart of one possible control method for the diode laser, FIG. 8, a first diagram of the electrical quantities of the diode laser plotted against time, and FIG. 9, a second diagram of the electrical quantities of the diode laser plotted against time.

In all drawings, corresponding parts have the same reference numbers.

FIG. 5 shows schematically a laser scanning microscope 1, consisting of a microscope unit M and a scanning unit S, having a common optical interface via an intermediate image Z. The scanning unit S can be connected both to the phototube of an upright microscope and to a side exit of an inverted microscope. The microscope unit M has an objective lens 4 and a tube lens 9 for observing a sample 5.

The scanning unit S contains a directly modulated laser diode 10 as the sole light source, collimation optics 11, a scanning objective lens 22, a scanner 23, a main beam divider 24 and imaging optics 25 for the detection. The laser diode 10, thanks to a control unit 12 according to the invention, has a fluctuation range of the rise times less than 1 µs. The control unit 12 comprises, in addition to means for a currentless current-limit optimization, a feedback control circuit for the optical power of the laser diode 10. Thanks to a semitransparent mirror 18, a monitoring beam is extracted in the direction of a monitoring diode 19, in front of which is placed a neutral filter 20. A deflection mirror 27 behind the imaging optics 25 reflects the light coming from the sample 5 in the direction of the diaphragm 29, which can be moved perpendicularly to the optical axis and changed in its diameter, behind which are arranged an emission filter 30 and a suitable receiving element 31, such as a secondary electron multiplier or "photomultiplier" (PMT).

In the scanning unit S there is arranged a central control unit 34, which is connected to local control units 12, 35 and 38 for the laser diode 10, the monitoring diode 19 and the adjustable diaphragm 29, respectively. The laser diode 10 is connected via the control unit 12 to a current source 13 in the form of a limit amplifier. The laser diode 10 can be short-circuited by control unit 12. Furthermore, the control unit 12 can adjustably limit the output current $I_Q$ of the current source 13.

FIG. 6 shows a second, largely similar, LSM 1, where the laser diode 10, with its control unit 12 and its current source 13, is arranged in a separate laser module L. The laser diode 10 is connected via input optics 33, an optical fiber 14, collimation optics 16 and a deflection mirror 17 to the beam path of the scanning unit S. The control unit 34 in this exemplary embodiment is externally located.

In FIG. 7, the method repeatedly carried out by the control unit 12 to control the laser diode 10 during scanning of the sample 5 by means of currentless current-limit optimization, is shown in the form of a flow chart. The method shown can be combined with the derivative optimization, which must be carried out by the higher-level control unit 34.

FIG. 8 shows schematically the electrical quantities of modulation voltage $U_{Mod}(t)$, optical power $P_{Opt}(t)$, and output current $I_Q(t)$ of the current source 13 as a function of time t, such as result for a single power-up process from carrying out the currentless current-limit optimization according to the invention. Also shown is the variation of the optical power $P_{Opt}'(t)$ without currentless current-limit optimization.

At time t=0, the control variable $U_{Mod}$ is 2 mV, for example, and thus lies below a lower threshold value U1=150 mV, for example, and below an upper threshold value U2=200 mV, for example (neither threshold value is shown, for sake of clarity). The laser diode 10 is short-circuited and therefore currentless, $I_D(0)=0$ A, although an intermediate current the size of the threshold current strength $I_S$ is already flowing from the current source 13. The laser diode 10 therefore does not emit any optical power, $P_{Opt}(0)=0$ W. The intermediate current is provided, at first regulated by the control unit 12, which limits the output current $I_Q$ of the current source 13, since the power regulating system of the laser diode 10, arranged inside the control unit 12, tries to attain a diode current $I_D$ corresponding to the control variable $U_{Mod}$ by raising the output current $I_Q$ of the current source 13. The control unit 34 now determines, for example, that the sample 5 is supposed to be exposed at a target power $P_{Soll}$ as of a time $t_3$. It thereupon makes a prediction as to the anticipated rise delay $\Delta t_V$ between the beginning of the rise, characterized by the corresponding raising of the control variable $U_{Mod}$, and the actual reaching of 50% of the target power $P_{Soll}$. Thanks to the use of the control according to the invention, as described below, the fluctuation range $\Delta\Delta t_V$ of all possible rise delays is almost zero, and so the rise delay is approximately constant, regardless of the target power $P_{Soll}$. The prediction can thus be done quickly and exactly in time. The control unit 34 therefore determines the point in time $t_1=t_3-\Delta t_V$ as a previous point in time for the start of the rise. At time $t_1$, the control unit 34 begins the rise by setting the control variable $U_{Mod}$ at the target value $U_{Soll}$, corresponding to the target power $P_{Soll}$. The control unit 12 determines the rising above the upper threshold value U2 and responds by removing the current limit of the current source 13. The output current $I_Q$ is thereupon determined by the power regulating system of the laser diode 10. This can now raise the output current $I_Q$ without limitation. When the output current $I_Q$ has exceeded a current strength corresponding to the target power $P_{Soll}$ by, say, 20%, the control unit 12 removes the short circuit via the laser diode 10. Thereupon, the power regulating system of the laser diode 10 causes a decline in the output current $I_Q$ and the now identical diode current $I_D$ to the current strength corresponding to the target power $P_{Soll}$. Thanks to the high intermediate level of the diode current $I_D$, the target optical power $P_{Soll}$ is achieved in minimum rise delay (and regardless of the target power $P_{Soll}$ with minimum fluctuation range of the rise delay), $P_{Opt}(t \geq t_3) = P_{Soll}$.

In alternative embodiments, the derivative optimization carried out by the control unit 34 can be used without the currentless current-limit optimization done by the control unit 12. This results on average in larger rise delays $\Delta t_V = t_4 - t_1$ and a larger fluctuation range $\Delta\Delta t_V$ of the rise times $\Delta t_V$.

In other alternative embodiments, the currentless current-limit optimization of the control unit 12 can be used without the derivative optimization of the control unit 34.

FIG. 9 shows schematically the electrical quantities of modulation voltage $U_{Mod}(t)$, optical power $P_{opt}(t)$, and output current $I_Q(t)$ of the current source 13 as a function of time t for an alternative embodiment of the currentless current-limit optimization, in which the control unit 12, after having determined the rise above the upper threshold value U2, at first removes the short circuit of the laser diode 10, so that intermediate current can flow through it, and only then removes the current limit of the current source 13. The output current $I_Q$ is thereupon determined by the power regulating system of the laser diode 10. This raises the output current $I_Q$ in a short time and with minimum fluctuation range of the rise time to the current strength corresponding to the target power $P_{Soll}$.

LIST OF REFERENCE NUMBERS 1 laser scanning microscope
4 objective lens
5 sample
9 tube lens
10 laser diode
11 collimation optics
12 control unit for the laser diode 10
13 current source
16 collimation optics
17 deflection minor
18 semitransparent mirror
19 monitoring diode
20 neutral filter
22 scanning objective lens
23 scanner
24 main beam divider
25 imaging optics
27 deflection prism
29 diaphragm
30 emission filter
31 receiving element
34 central control unit
35 control unit for the monitoring diode 19
38 control unit for the diaphragm 29
M microscope unit
S scanning unit
$U_{Mod}$ modulation voltage
$U_{Soll}$ target value for modulation voltage
$P_{Opt}(\cdot)$, P1, P2 optical power
$P_{Soll}$ target value for optical power
$I_Q$ output current
$I_S$ threshold current
t time
$t_i$ points in time
A control signal
$\Delta t_{A (1,2)}$ rise time
$\Delta t_{V (1,2)}$ rise delay
$\Delta\Delta t_V$ variation of the rise delay

The invention claimed is:

1. A method for controlling a directly modulated laser diode of a laser scanning microscope, during a scanning process, wherein the light intensity of the laser diode has a rise delay that is dependent on the magnitude of an applied control variable, comprising the steps of:
   a) identifying that the light intensity to be achieved with the laser diode falls below a lower threshold value or that the light intensity already achieved with the laser diode is below the lower threshold value,
   b) after the light intensity to be achieved with the laser diode is identified as falling below a lower threshold value or after the light intensity already achieved with the laser diode is identified as being below the lower threshold value, de-energizing the laser diode by removing the flow of an intermediate current through the laser diode,
   c) identifying that the light intensity to be achieved when the intermediate electric current is flowed through the laser diode rises above an upper threshold value,
   d) restoring the flow of the intermediate current through the laser diode, and
   e) setting the diode current according to the light intensity to be achieved.

2. The method according to claim 1, wherein the laser diode is de-energized by short circuiting the laser diode, and wherein the method further comprises removing the short circuit to restore the flow of current to the laser diode.

3. The method according to claim 2, wherein the intermediate current is provided by limiting an output current of a current source to the strength of the intermediate current.

4. The method according to claim 3, further comprising the step of removing the current limit for the adjusting of the diode current.

5. The method according to claim 3, further comprising removing the current limit or setting the current limit at a maximum current for the laser diode, after identifying that the light intensity to be achieved exceeds the upper threshold value, and before flowing the intermediate current through the laser diode.

6. The method according to claim 5, further comprising raising the intermediate current to a current strength above a current strength corresponding to the light intensity to be achieved, using a current or power regulation of the laser diode, after removing the current limit and before flowing the intermediate current through the laser diode.

7. The method according to claim 5, wherein the diode current is adjusted using a current or power regulation of the laser diode.

8. The method according to claim 1, wherein the light intensity to be achieved is determined using a control variable for a feedback control of the laser diode.

9. The method according to claim 8, wherein the control variable is a modulation voltage (UMod).

10. The method according to claim 1, wherein at least one threshold current strength (IS) of the laser diode—is used for the provided intermediate current.

11. The method according to claim 1, wherein the lower threshold value and the upper threshold value are identical.

12. A control unit for a directly modulated laser diode of a laser scanning microscope, wherein the laser diode is connected to a power source and the light intensity of the laser diode has a rise delay that is dependent on the magnitude of an applied control variable, comprising:
lower threshold identifying means for identifying that the light intensity to be achieved with the laser diode falls below a lower threshold value or that the light intensity already achieved with the laser diode is below the lower threshold value,
upper threshold identifying means for identifying that the light intensity to be achieved after re-energizing of the laser diode rises above an upper threshold value, and
means for removing the flow of an intermediate current through the laser diode to de-energize the laser diode when the light intensity to be achieved with the laser diode is identified as falling below a lower threshold value or that the light intensity already achieved with the laser diode is identified as being below the lower threshold value, and for restoring the flow of the intermediate current through the laser diode when the that the light intensity to be achieved is identified as rising above an upper threshold value, and
means for setting the diode current according to the light intensity to be achieved subsequent to restoring the flow of the intermediate current through the laser diode.

13. The control unit according to claim 12, wherein the lower threshold identifying means and the upper threshold identifying means are configured as at least one of an electric and electronic monitoring circuit, which is connected upstream of a current or power feedback control circuit of the laser diode.

14. The control unit according to claim 12, wherein the means for de-energizing comprises means for short-circuiting the laser diode, and the means for flowing of the provided intermediate current comprises means for removing the short circuit.

15. The control unit according to claim 12, wherein the means for providing an intermediate electric current comprises a limitable current source.

16. The control unit according to claim 15, wherein the limitable current source comprises a limit amplifier.

17. The control unit according to claim 15, wherein the means for setting the diode current comprises means for removing the current limitation.

18. The control unit according to claim 15, further comprising means for raising the intermediate current, which after identification that the light intensity to be achieved exceeds the upper threshold value, and before current is flowed through the laser diode, remove the current limitation or adjust to a maximum current of the laser diode.

19. The control unit according to claim 18, further comprising a current or power regulating system of the laser diode for raising the intermediate current to a current strength above a current strength corresponding to the light intensity to be achieved, after the current limitation is removed and before current is flowed through the laser diode.

20. The control unit according to claim 12, wherein the lower threshold identifying means and the upper threshold identifying means comprise means for determining a control variable for a feedback control of the laser diode.

21. The control unit according to claim 20, wherein the control variable is a modulation voltage (UMod).

22. The control unit according to claim 12, wherein the provided intermediate current has at least a strength of a threshold current (IS) of the laser diode.

23. A laser module for a laser scanning microscope, comprising:
the control unit according to claim 12,
a directly modulated laser diode, and
a current source for the laser diode.

24. A laser scanning microscope, comprising:
a power source,
a directly modulated laser diode having a light intensity with a rise delay that is dependent on the magnitude of an applied control variable, the laser diode being connected to the power source,
an electrical control unit for direct modulation of the laser diode, wherein the electrical control unit is configured so that the fluctuation range ($\Delta\Delta t_V$) of the rise delays ($\Delta t_V$) is less than 1 µs, and includes:
lower threshold identifying means for identifying that the light intensity to be achieved or already achieved with the laser diode falls below a lower threshold value or is below the lower threshold value,
means for de-energizing of the laser diode subsequent to identifying that the light intensity to be achieved or already achieved with the laser diode falls below a lower threshold value or is below the lower threshold value,
means for providing an intermediate electric current subsequent to de-energizing of the laser diode,
upper threshold identifying means for identifying that the light intensity to be achieved rises above an upper threshold value,
means for flowing of the provided intermediate current through the laser diode subsequent to identifying that the light intensity to be achieved rises above an upper threshold value, and
means for setting the diode current according to the light intensity to be achieved subsequent to flowing of the provided intermediate current through the laser diode.

25. The control unit according to claim 24, wherein said control unit is configured such that the fluctuation range ($\Delta\Delta t_V$) of the occurring rise delays ($\Delta t_V$) is less than 0.5 µs.

* * * * *